United States Patent [19]

Saikawa et al.

[11] Patent Number: 5,427,889
[45] Date of Patent: Jun. 27, 1995

[54] LITHOGRAPHIC PRINTING PLATE WITH PITTED ALUMINUM SUPPORT

[75] Inventors: Masahiko Saikawa; Akira Kaneko; Keisuke Iguchi; Akio Yoshida; Yutaka Araki; Takenobu Yoshiki, all of Tokyo, Japan

[73] Assignee: Mitsubishi Paper Mills Ltd., Japan

[21] Appl. No.: 289,374

[22] Filed: Aug. 12, 1994

[30] Foreign Application Priority Data

| Aug. 13, 1993 | [JP] | Japan | 5-201561 |
| Aug. 13, 1993 | [JP] | Japan | 5-201562 |
| Aug. 17, 1993 | [JP] | Japan | 5-203213 |
| Aug. 17, 1993 | [JP] | Japan | 5-203214 |
| Aug. 17, 1993 | [JP] | Japan | 5-203215 |
| Aug. 19, 1993 | [JP] | Japan | 5-205409 |
| Aug. 19, 1993 | [JP] | Japan | 5-205410 |
| Aug. 31, 1993 | [JP] | Japan | 5-215770 |
| Aug. 31, 1993 | [JP] | Japan | 5-215771 |
| Oct. 14, 1993 | [JP] | Japan | 5-256830 |

[51] Int. Cl.$^6$ .......... G03C 8/28; G03C 8/42; G03F 7/07
[52] U.S. Cl. .................. 430/204; 430/230; 430/231; 430/278; 101/459
[58] Field of Search .......... 430/204, 231, 230, 278; 101/459

[56] References Cited

U.S. PATENT DOCUMENTS

| 3,511,661 | 5/1970 | Rauner et al. | 430/278 |
| 3,861,917 | 1/1975 | Magnotta et al. | 101/459 |
| 4,149,889 | 4/1979 | Yoshida et al. | 430/204 |
| 4,175,965 | 11/1979 | Yoshida et al. | 430/204 |
| 4,301,229 | 11/1981 | Sakaki et al. | 430/302 |
| 4,621,041 | 11/1986 | Saikawa et al. | 430/204 |
| 4,655,136 | 4/1987 | Reiss et al. | |
| 5,061,591 | 10/1991 | Nakanishi et al. | 430/278 |
| 5,156,940 | 10/1992 | Kok et al. | 430/204 |
| 5,273,858 | 12/1993 | Coppens et al. | 430/204 |

FOREIGN PATENT DOCUMENTS 0278766 8/1988 European Pat. Off.
81/02547 9/1981 WIPO.

*Primary Examiner*—Richard L. Schilling
*Attorney, Agent, or Firm*—Cushman Darby & Cushman

[57] ABSTRACT

The present invention provides a lithographic printing plate material which comprises a grained and anodized aluminum support and a silver halide emulsion layer between which physical development nuclei are provided wherein said aluminum support have 500 or more pits having a diameter of 0.03–0.30 μm and an average diameter of 0.05–0.20 μm per 100 μm$^2$.

9 Claims, No Drawings

LITHOGRAPHIC PRINTING PLATE WITH PITTED ALUMINUM SUPPORT

BACKGROUND OF THE INVENTION

The present invention relates to a lithographic printing plate having an aluminum sheet as a support and particularly to a lithographic printing plate subjected to silver complex diffusion transfer process.

As for the lithographic printing plates made using the silver complex diffusion transfer process (DTR process), some examples are described in Andre Rot and Edis Wide, "Photographic Silver Halide Diffusion Process", pages 101-130, published from Focal Press, London and New York (1972).

As described therein, lithographic printing plates made using DTR process include two types, namely, the two-sheet type in which a transfer material and an image receiving material are separated and mono-sheet type which comprises the transfer material and the image receiving material which are provided on one support. The two-sheet type lithographic printing plates are described in detail in Japanese Patent Kokai No. 57-158844. The mono-sheet type lithographic printing plates are described in detail in Japanese Patent Kokoku Nos. 48-30562 and 51-15765 and Japanese Patent Kokai Nos. 51-111103 and 52-150105.

In the case of lithographic printing plates using paper as a support, it is difficult to obtain prints of high qualities including printing endurance owing to the elongation of plate or permeation of water during printing. In order to improve these problems and enhance printing performances, film supports are used. Examples of the films utilized as a support are cellulose acetate film, polyvinyl acetal film, polystyrene film, polypropylene film, polyethylene terephthalate film, and composite films such as polyester, polypropylene or polystyrene films clad with a polyethylene film.

The lithographic printing plates using a film as a support are improved in elongation of plate or permeation of water as compared with the printing plates using the paper support, but they are still insufficient in printing endurance, water retention and mountability on printing machines.

In order to solve the various problems of the lithographic printing plates in which paper or film supports are used, silver salt type lithographic printing plates in which metallic supports, especially aluminum supports are used are known and disclosed in Japanese Patent Kokai Nos. 57-118244, 57-158844, 63-260491, 3-116151 and 4-282295.

Japanese Patent Kokai Nos. 63-260491, 3-116151 and 4-282295 describe lithographic printing plate materials of mono-sheet type which comprise a grained and anodized aluminum sheet as a support, physical development nuclei provided on the support and a photosensitive silver halide emulsion layer provided on the nuclei and to which the DTR process is applied. The lithographic printing plate materials are exposed imagewise and subjected to DTR development and then, the silver halide emulsion layer is removed by washing with warm water to make printing plates. However, these patent publications concern with techniques directed to prevention of corrosion of the aluminum sheet caused by contact of the aluminum sheet with the silver halide emulsion and the printing plates are not satisfactory in ink-receptivity of transferred silver images and in printing endurance.

In general, the aluminum sheet used for lithographic printing plate materials is grained in its surface for improving wettability (water retention) by dampening water in printing and furthermore, for improving adhesion to the photosensitive layer. The graining can be carried out mechanically by, for example, ball, wire and brush graining, chemically by dissolving aluminum with chlorides, fluorides, etc., and electrolytically by dissolving aluminum, and combinations of these treatments. See, for example, Japanese Patent Kokai Nos. 48-28123, 53-123204, 54-146234, 55-25381, 55-132294, 56-55291, 56-150593, 56-28893, and 58-167196, and U.S. Pat. Nos. 2,344,510, 3,861,917 and 4,301,229. With reference to the surface configuration of the aluminum sheet, U.S. Pat. No. 2,344,510 describes grain structure made by carrying out mechanical graining and electrolytic graining, U.S. Pat. No. 4,301,229 describes cumulative frequency distribution of pit diameter and arithmetical mean deviation of profile, U.S. Pat. No. 3,861,917 describes depth of grained surface, Canadian Patent No. 955449 describes height and diameter of peaks of grained surface and West German Patent No. 1,813,443 describes difference of altitude of grained surface.

After subjected to these graining treatments, the aluminum sheet is subjected to anodizing treatment in an electrolyte such as sulfuric acid, phosphoric acid, nitric acid or a mixed solution thereof.

As mentioned above, there have been proposed various aluminum sheets for printing plates which differ in surface configuration and structure and which are produced under various surface treating conditions depending on kinds of lithographic printing plates and uses of printing. However, in the case of the lithographic printing plate to which the present invention is applied, except the functions to improve wettability with dampening water (water retention) and to improve adhesion to the photosensitive layer, it has not been known that the diffusion transfer development of silver halide affects the printing function of silver film formed on the surface of the aluminum sheet, specifically, it has not been known which surface configuration of aluminum sheets is preferred for ink-receptivity and printing endurance. Furthermore, no elucidation has been made on the factors for forming silver images of high quality and high printing endurance on the surface of the aluminum sheet by controlling the diffusion transfer development of the silver halide.

Especially, the direct plate-making method has begun to be put to practical use which comprises subjecting printing plate materials to flash exposure of very high intensity and short time ($10^{-5}$ second or less) with various laser beams such as helium-neon laser, argon laser, and semiconductor laser, light emitting diode (LED), cathode ray tube (CRT) by scanning exposure method, and the printing plate materials which use an aluminum sheet as a support are also strongly demanded to have characteristics and performances suitable to the above exposing methods.

U.S. Pat. No. 4,621,041 discloses that good printing characteristics with high sensitivity can be given to DTR printing plate materials having a physical development nuclei layer as a surface layer which are to be subjected to scanning type exposure by using a silver halide emulsion containing at least 70 mol % of silver chloride and a water-soluble gold compound and to which is added a water-soluble iridium compound at the time of emulsification or physical ripening. However, there is the problem that printing plates excellent in quality and printing endurance cannot necessarily be obtained by mere use of the silver halide emulsion described in U.S. Pat. No. 4,621,041 as a silver halide emulsion of lithographic printing plate materials having physical development nuclei between an aluminum support and a silver halide emulsion layer.

On the other hand, negative.positive lithographic printing plate materials of high sensitivity are needed in the system of direct outputting to printing plate materials from microfilms. Furthermore, with recent development of electronics, an attempt has been made to carry out direct outputting to printing plate materials through an image setter without using an intermediate pre-press film by combination processing of letters and images. The image setters used in this case use scanning type exposing light sources such as argon laser, helium-neon laser, red light emitting diode (red LED), red semiconductor laser (red LD), and infrared semiconductor laser (infrared LD). In the case of lithographic printing plate materials described in Japanese Patent Kokai Nos.63-260491, 3-116151 and 4-282295 which are of mono-sheet type comprising a grained and anodized aluminum support, physical development nuclei provided on the support and a photosensitive silver halide emulsion layer provided on the physical development nuclei and which utilize the DTR process, usually the exposed portion is non-image portion when the above image setters are used and image reversing outputting must be conducted. Moreover, for some apparatuses, for example, an external drum, there may be the portions which cannot be exposed, such as the portions held on the drum. Therefore, preferred are negative type lithographic printing plate materials in which the exposed portion is image portion. Although there is the description in Japanese Patent Kokai No. 3-116151 that such negative type lithographic printing plate materials are useful for laser exposure, no preferable specific embodiments have been elucidated.

The inventors have conducted various investigations on the processing method of the above-mentioned lithographic printing plate materials which use previously fogged direct positive silver halide emulsions and have found the following problems. That is, when these lithographic printing plate materials are developed with the developers described in the above patent publications, the resulting images are inferior in quality and the resulting printing plates are insufficient in printing endurance.

SUMMARY OF THE INVENTION

The first object of the present invention is to provide a lithographic printing plate material having an aluminum sheet as a support which is improved in image quality, ink receptivity and printing endurance.

The second object of the present invention is to provide a lithographic printing plate material having an aluminum sheet as a support which has high image quality and high printing endurance and is of scanning exposing type.

The third object of the present invention is to provide a negative type lithographic printing plate material having an aluminum sheet as a support which is improved in image quality and printing endurance.

The fourth object of the present invention is to provide a method for processing a negative type lithographic printing plate material having an aluminum sheet as a support which is improved in image quality and printing endurance.

The above objects have basically been attained by a lithographic printing plate material which comprises a grained and anodized aluminum support and a silver halide emulsion layer between which physical development nuclei are present wherein said aluminum support is an aluminum sheet which has 500 or more pits of 0.03–0.30 $\mu$m in diameter per 100 $\mu$m$^2$ and an average diameter of the pits is 0.05–0.20 $\mu$m.

Furthermore, preferred embodiments of the present invention are obtained by the lithographic printing plate material having an aluminum sheet as a support and having the construction mentioned hereinafter and a method of processing mentioned hereinafter.

DESCRIPTION OF THE INVENTION

The inventors have made an intensive research based on the idea that the state of formation of transferred and developed silver which governs the ink receptivity and the printing endurance of the lithographic printing plates intended by the present invention has relation to the grain structure of the surface of aluminum sheet. As a result, it has been found that transferred and developed silver which is very strong against printing can be formed when a grained and anodized aluminum sheet having very small pits thereon is used as a support. Thus, the present invention has been accomplished. That is, in the lithographic printing plate of the present invention in which the above-mentioned aluminum sheet having specific grain structure, the transferred and developed silver is formed in the many small pits which exhibit anchoring effect and moreover the transferred and developed silver forms a continuous dense oleophilic layer which adheres to the aluminum sheet. Therefore, the transferred and developed silver does not rub off even when printing is carried out for a long time and a high printing endurance can be attained.

The grained and anodized aluminum sheet used in the present invention can be easily identified by a microphotograph of about 50,000 times in magnification taken using a scanning electron microscope. On the surface of the aluminum sheet there are present 500 or more, preferably about 1,000 or more pits having a diameter of 0.03–0.30 $\mu$m per 100 $\mu$m$^2$. The upper limit of the number of the pits is preferably about 15,000. The average diameter of the pits having a diameter of 0.03–0.30 $\mu$m is 0.05–0.20 $\mu$m, preferably 0.05–0.15 $\mu$m. As for the pit which is not circular, the size of the pit regarded as a circle is taken as its diameter. Desirably, the center depth of the pit is $\frac{1}{8}$ time (0.01–0.10 $\mu$m) or more, preferably $\frac{1}{6}$ time (0.015–0.15 $\mu$m)—3 times (0.09–0.90 $\mu$m) the diameter.

The aforementioned Japanese Patent Kokai No. 56-28893 describes a grain structure of a composite structure comprising plateaus (primary structure) and pits (secondary structure formed on the surface of the plateaus) on the surface of aluminum formed by using mechanical graining and chemical etching and electrolytic graining in combination. The pits of the present invention preferably have a composite structure that they are present on large pits of 3–15 $\mu$m in average diameter (plateaus). The projected area of the minute pits is preferably about 5–40% and the projected area of the large pits (plateaus) is preferably 50–95%. The center line average roughness (Ra) is preferably in the range of 0.3–1.0 $\mu$m. Such surface configuration of the aluminum sheet of the present invention is determined by combination of various conditions such as mechanical graining conditions, chemical graining conditions, electrolytic graining conditions, anodizing conditions, alloy compositions of the aluminum sheet, etc., but can be relatively easily found by subjecting to electrolytic graining with adjusting kind of acid, concentration of acid, electrolysis temperature, current density, applied voltage, etc. and subsequently, subjecting to anodizing treatment. If the number of the small pits is less than 500 or there are no small pits and there are only the large pits (plateaus) or if the number of the pits having an average diameter of 0.30 $\mu$m is 500 or more per 100 $\mu m^2$, the resulting ink receptivity and printing endurance are inferior to those of the lithographic printing plate of the present invention.

After subjected to the graining treatment, the aluminum sheet must be subjected to anodizing treatment. The anodizing treatment can be carried out by conventionally well known methods. Sulfuric acid, phosphoric acid, nitric acid or mixtures thereof are useful as electrolytes. A mixture of sulfuric acid and phosphoric acid as disclosed in Japanese Patent Kokai No. 55-28400 is also useful.

The sulfuric acid method is carried out usually with a direct current, but alternating current can also be used. The concentration of the sulfuric acid used is 5–30%. The electrolysis is carried out at 20°–60° C. for 5–250 seconds to form 1–10 $g/m^2$ of an anodized film on the surface. Furthermore, the current density in this case is preferably 1–20 $A/dm^2$. The phosphoric acid method is carried out at a concentration of 5–50%, a temperature of 30°–60° C., for 10–300 seconds and with a current density of 1–15 $A/dm^2$. The amount of the thus anodized aluminum can be measured by the chemical stripping method described in JIS H8680.

Thickness of the anodized film of the grained and anodized aluminum sheet used in the present invention is preferably in the range of about 0.3–3.0 $\mu$m. It is preferred to subject the aluminum sheet to desmutting treatment prior to the anodizing treatment. That is, the aluminum substrate subjected to the graining treatment is treated with 10–50% of hot sulfuric acid (40°–60° C.) or a dilute alkali (such as sodium hydroxide) to remove the smut sticking to the surface.

Furthermore, if necessary, post-treatments can be carried out after the anodization. For example, the anodized sheet is dipped in an aqueous polyvinylphosphonic acid solution as disclosed in British Patent No. 1,230,447. Moreover, if necessary, an undercoat layer of a hydrophilic polymer can be provided and this is selected depending on the properties of the photosensitive layer to be provided thereon.

The silver halide emulsion used for the lithographic printing plate material of the present invention having an aluminum sheet as a support is selected from generally used silver chloride, silver bromide, silver iodide, silver chlorobromide, silver chloroiodobromide, silver iodobromide, etc. The type of the emulsion may be either negative or positive. If necessary, the silver halide emulsions can be subjected to chemical sensitization or spectral sensitization. For example, the silver halide emulsions can be sensitized with dyes such as cyanines and merocyanines. There is no special limitation in the wavelength region to which the emulsions can be sensitized, but they can be sensitized so that they are sensitive to the emission wavelength region of scanning type exposure light sources. Therefore, sensitizations for argon laser, red semiconductor laser (red LD), infrared semiconductor laser (infrared LD), helium-neon laser, and red light emitting diode (red LED) can be effected.

Grain size of the silver halide emulsions used in the present invention is preferably in the range of 0.2–0.6 $\mu$m and 90% by weight or more of total grains have a size within ±30% of the average grain size. If the grain size is smaller than 0.2 $\mu$m, dissolution is too rapid and the grains readily escape into the bulk developer from the surface of the silver halide emulsion layer and do not contribute to the diffusion transfer development. If it is larger than 0.6 $\mu$m, the dissolution is delayed and the efficiency of diffusion transfer development on the grained and anodized surface of aluminum sheet having many extremely small pits lowers to cause deterioration of image quality. If the grains having a size within ±30% of the average grain size are less than 90% by weight, printing endurance deteriorates. Of the silver halide having the above grain size, preferred are silver chloride and silver chlorobromide, silver chloroiodide, silver chloroiodobromide, etc. containing at least 85% of silver chloride, which give lithographic printing plates further excellent in image quality and printing endurance.

The silver halide emulsion in the lithographic printing plate material of the present invention having the above aluminum sheet as a support may contain a water-soluble gold compound and a water-soluble iridium compound in order for adapting the lithographic printing plate material to direct plate making according to which the lithographic printing plate material is subjected to flash exposure of very high intensity for a very short time (shorter than $10^{-5}$ second) by scanning exposing method using various laser beams such as those of helium-neon laser, argon laser, and semiconductor laser, light emitting diode (LED), cathode ray tube (CRT), etc.

The water-soluble gold compounds include, for example, chloroauric acid, potassium chloroaurate, auric trichloride, potassium aurothiocyanate, potassium iodoaurate and ammonium aurothiocyanate. These can be added at an optional stage during emulsification, physical ripening, or chemical ripening or after completion of the chemical ripening of silver halide. Amount of the water-soluble gold compound can be in the range of $10^{-6}$–$10^{-2}$ mol based on 1 mol of silver halide. Various water-soluble iridium compounds can be used and examples are iridium chloride, hexahalogenoiridic (III) acid or salts thereof, hexahalogenoiridic (IV) acid or salts thereof. Amount of the water-soluble iridium compound is $10^{-6}$–$10^{-2}$ mol based on 1 mol of silver halide. The water-soluble iridium compound is added at the time of emulsification or physical ripening of the silver halide.

Various hydrophilic colloids may be used as protective colloids in the silver halide emulsion layer. That is, there may be used various gelatins such as acid-treated gelatins, alkali-treated gelatins, gelatin derivatives, and grafted gelatins and besides, hydrophilic polymer compounds such as polyvinyl pyrrolidone, various starches, albumin, polyvinyl alcohol, gum arabic, and hydroxyethylcellulose. As the hydrophilic colloids, mention may be made of gelatin, gelatin derivatives, polyvinyl alcohol, polyvinyl pyrrolidone and it is desirable to use a hydrophilic colloid layer containing substantially no hardener in order to enhance the peelability of the hydrophilic colloid layer after physical development.

In the present invention, compounds having a mercapto group or a thione group may be used for further improvement of fine dot image forming ability and printing endurance. Examples of these compounds are 5- or 6-membered nitrogen-containing heterocyclic compounds such as 2-mercapto-4-phenylimidazole, 2-mercaptobenzimidazole, 2-mercapto-1-ethyl-benzimidazole, 1,3-diethyl-benzimidazoline-2-thione, 2-mercaptobenzothiazole, 2-mercaptonaphthothiazole, 3-ethyl-benzothiazoline-2-thione, 2-mercapto-4,5-diphenyloxazole, 2-mercaptobenzoxazole, 3-pentyl-benzoxazoline-2-thione, 2-mercapto-5-phenyl-1,3,4-thiadiazole, 2-mercapto-5-phenyl-1,3,4-oxadiazole, 2-mercapto-1,3,4-oxadiazole, 2-mercapto-5-methyl-1,3,4-oxadiazole, 2-mercapto-5-heptyl-1,3,4-oxadiazole, 3-mercapto-4-benzamide-1,2,4-triazole, 3-mercapto-4-phenylacetamide-5-methyl-1,2,4-triazole, 3-mercapto-4-amino-5-phenyl-1,2,4-triazole, 3-mercapto-4-acetamide-5-heptyl-1,2,4-triazole, 3-mercapto-4-benzamide-5-heptyl-1,2,4-triazole, 1-phenyl-5-mercaptotetrazole, and 2-mercapto-4,6-diphenyl-1,3,5-triazine.

The above compounds having a mercapto group or a thione group can be contained in at least one of silver halide emulsion layer, physical development nuclei layer, intermediate layer, protective layer, etc. Preferably, they are contained in at least the silver halide emulsion layer. Regarding the amount of the compound having a mercapto group or a thione group, the larger amount is preferred for prevention of corrosion of aluminum, but from the viewpoints of fine dot image formation and high printing endurance, it is $10^{-5}$–$10^{-2}$ mol, preferably $5 \times 10^{-5}$–$5 \times 10^{-2}$ mol for 1 mol of silver halide.

The inventors have conducted intensive research based on the idea that in the lithographic printing plate intended by the present invention, the state of formation of the transferred and developed silver which governs the ink receptivity and the printing endurance might have relation to the amount of the anodized film of the aluminum sheet and the amount of the hydrophilic binder including the photosensitive layer coated on the aluminum sheet. As a result, it has been found that an effectively transferred and developed silver can be formed on the anodized aluminum support by setting the weight ratio of the anodized film to the total weight of the hydrophilic binder to be 2 or more, and thus, ink receptivity and printing endurance are further improved. That is, it can be easily expected that with increase of the coating amount of the hydrophilic binder, the longer time is required for the silver complex to reach the anodized film owing to the decrease in penetration speed of developer or the increase in diffusion distance of the silver complex and on the other hand, with decrease of the coating amount of the hydrophilic binder, relatively the shorter time is required for the silver complex to reach the anodized film.

In order to form a firm silver image on the anodized film, it is generally necessary that the silver complex is effectively taken in the small pits present on the anodized film and as mentioned above, it can be easily expected that the speed for the silver complex reaching the pits on the anodized film is greatly affected by the coating amount of the hydrophilic binder. For the lithographic printing plate intended by the present invention, various photosensitive emulsions are used depending on the use and the performances and qualities required, and there is an optimum coating amount of the hydrophilic binder depending on the kind of the photosensitive emulsions. It has been found that depending on the coating amount of the hydrophilic binder, there is the possibility of effectively transferred and developed silver being not formed because of the change in the speed for the silver complex to reach the pits on the anodized film as mentioned above.

The inventors have found that by setting the weight ratio of the amount of the anodized film to the coating amount of the hydrophilic binder to be 2 or more, an effectively transferred and developed silver can be formed in the pits on the anodized film irrespective of the coating amount of the hydrophilic binder. It can be considered that this is because the speed of the silver complex being taken into the pits on the anodized film is increased due to some mechanism as a result of increase of the coating amount of the anodized film.

In the present invention, amount of the anodized aluminum is preferably 1.0–10.0 g/m$^2$, more preferably 1.5–5 g/m$^2$.

As physical development nuclei in the physical development nuclei layer, there may be used known ones which are used for the silver complex diffusion transfer process, for example, colloids such as gold and silver and metal sulfides such as mixtures of water-soluble salts of palladium, zinc or the like with sulfides. Various hydrophilic colloids can also be used as protective colloids. Regarding details and production processes thereof, reference can be made to, for example, Andre Rot and Edis Wide, "Photographic Silver Halide Diffusion Processes", Focal Press, London and New York (1972).

In the present invention, in order to further improve ink receptivity and printing endurance, the physical development nuclei can be allowed to substantially contact with the anodized layer. This embodiment means the state where the colloid particles as the physical development nuclei are not completely covered with the protective colloid and at least a part of the nuclei colloid particles contact with the anodized layer. A typical example for attaining such contacting state is to use physical development nuclei of hydrosol with no protective colloid. When the physical development nuclei have protective colloid, the amount thereof is preferably about 100% by weight or less based on the physical development nuclei. Particle size of the physical development nuclei is generally in the range of about 50-about 100 Å.

The present invention can also be applied to negative type lithographic printing plate materials. That is, an aluminum sheet having 500 or more pits having a diameter of 0.03–0.30 μm and having an average diameter of 0.05–0.20 μm per 100 μm$^2$ can be used as a support and a previously fogged direct positive silver halide emulsion can be provided as a silver halide emulsion. The previously fogged direct positive silver halide emulsion is a silver halide emulsion in which the surface of the silver halide grains is previously fogged by reduction sensitization + gold sensitization and which contains an electron accepting compound as disclosed in U.S. Pat. No. 3,501,307.

In the above silver halide emulsion, the surface of silver halide grains is suitably fogged, for example, by using reducing agents and gold compounds in combination or by allowing a gold compound to act on the emulsion with lowering pAg at the time of chemical ripening in place of using the reducing agent.

The reducing agents used for fogging the silver halide include, for example, aldehyde compounds such as formalin, inorganic reducing agents such as hydrazine, triethylenetetramine, thiourea dioxide and iminoamino-methanesulfinic acid, and amineborane.

The gold compounds used for fogging the silver halide include, for example, potassium chloroaurate, chloroauric acid and gold thiocyanate.

The direct positive silver halide emulsion can also be fogged by combination of the above-mentioned methods with sulfur-containing compounds (such as sodium thiosulfate, potassium thiosulfate and allylthiourea) or thiocyanic acid compounds (such as potassium thiocyanate and ammonium thiosulfate).

The above-mentioned electron acceptors are characterized by the polarographic half-wave potential, namely, oxidation-reduction potential determined by polarography. The electron acceptors useful in the present invention have a positive sum of polarographic anodic potential and polarographic cathodic potential. The method for measuring the oxidation-reduction potentials is described, for example, in U.S. Pat. No. 3,501,307. Especially effective electron acceptors are imidazo[4,5-b]quinoxaline.cyanine dyes described in Belgian Patent No. 660,253. Another effective electron acceptors are indole.cyanine dyes nuclear substituted at 2-position described in U.S. Pat. Nos. 3,314,796 and 3,505,070.

The electron acceptor is used at a concentration of preferably 0.1–2.0 g, more preferably 0.2–0.6 g per 1 mol of silver halide. Examples of the electron acceptor used in the present invention are 1,1′-dimethyl-2,2′-diphenyl-3,3′-indolocarbocyanine.bromide, 2,2′-di-p-methoxyphenyl-1,1′-dimethyl-3,3′-indolocarbocyanine.bromide, 1,1′-dimethyl-2,2′,8-triphenyl-3,3′-indolocarbocyanine.perchlorate, 1,3-diallyl-2-[2-(9-methyl-3-carbazolyl)vinyl]imidazo[4,5-b]-quinoxalium.p-toluenesulfonate, 1,3-diethyl-1′-2′-phenyl-.imidazo[-4,5-b]quinoxalino-3′-indolocarbocyanine.iodide, 1,1′,3,3′-tetraethylimidazo[4,5-b]-quinoxalinocarbocynaine. chloride, 1,1′,3,3′-2-phenyl-3-indolopyrrolo[2,3-b]pyridocarbocynaine.iodide, 1,1′,3,3,3′,3′-hexamethylpyrrolo[2,3-b]pyridocarbocyanine.perchlorate, 1,1′,3,3-tetramethyl-5-nitro-2′-phenylindo-3′-indocarbocyanine.iodide, 1,1′,3,3,3′,3′-hexamethyl-5,5′-dinitroindocarbocyanine.p-toluenesulfonate, 3′-ethyl-1-methyl-2-phenyl-6′-nitro-3-indolothiacarbocyanine.p-toluenesulfonate, pynakryptol yellow, 5-m-nitrobenzylidenerhodanine, 5-m-nitrobenzylidene-3-phenylrhodanine, and 1,3-diethyl-6-nitrothia-2′-cyanine.iodide.

The silver halide emulsions used for the previously fogged direct positive silver halide emulsions are selected from the above-mentioned silver chloride, silver bromide, silver iodide, silver chlorobromide, silver chloroiodobromide, silver iodobromide, etc. and these silver halide emulsions may be optionally subjected to chemical sensitization or spectral sensitization.

The present invention further provides a method for processing the lithographic printing plate in which the previously fogged direct positive silver halide emulsion is used, in the presence of a polyalkylene oxide having a molecular weight of 600 or less, preferably 200–400. The image quality and printing endurance can be improved by this processing method.

It is known to add polyethylene oxide as a developing accelerator as described in T. H. James, "The Theory of the Photographic Process", 4th ed., pages 424–426. However, in this case, it is known that the development accelerating effect of polyethylene oxide is exhibited when n in $HO(CH_2CH_2O)_nH$ is at least 10–20 and with increase of n, the effect increases, but a polyethylene oxide of lower molecular weight is small in the effect.

However, the inventors have found that when lithographic printing plate materials using previously fogged direct positive silver halide emulsion are developed in the presence of a polyethylene oxide, the development is extremely hindered in the case of adding a known polyethylene oxide of high molecular weight while the development is rather accelerated in the case of adding an unknown low molecular weight polyalkylene oxide having a molecular weight of 600 or less and as a result, lithographic printing plates of high image quality and sufficient printing endurance can be obtained.

The polyalkylene oxide of 600 or less in molecular weight can be contained in the layers constituting the lithographic printing plate material such as photosensitive layer or in the developer. When it is contained in the layers constituting the lithographic printing plate material, amount thereof is preferably 0.1–5 g/m$^2$. When it is contained in the developer, amount thereof is preferably 1–100 g per 1 liter of the developer. As the alkylene oxide component, for example, polyethylene oxide, polypropylene oxide, polybutylene oxide, etc. can be used each alone or in combination of two or more.

The developer used for developing the lithographic printing plate material of the present invention can contain developing agents such as polyhydroxybenzenes and 3-pyrazolidinone; alkaline substances such as potassium hydroxide, sodium hydroxide, lithium hydroxide, trisodium phosphate and amine compounds; preservatives such as sodium sulfite; thickeners such as carboxymethylcellulose; antifoggants such as potassium bromide and 1-phenyl-5-mercaptotetrazole; and development modifiers such as polyoxyalkylene compounds. Furthermore, the developer preferably contains silver halide solvents such as amine compounds, sodium thiosulfate and potassium thiocyanate.

The developer has a pH of usually about 10–14, preferably about 12–14, but this varies depending on the conditions of pretreatments (such as anodization) of aluminum support, photographic elements, desired images, kinds and amounts of various compounds in the developer, developing conditions, etc.

Washing-off for removing gelatin layers can be carried out with running water of about 20°–30° C.

The present invention will be explained by the following examples.

EXAMPLE 1

Aluminum sheets of 0.30 mm thick having the surface configurations as shown in Table 1 were produced by elctrolytic graining treatment under various conditions and by anodization.

TABLE 1

| Aluminum sheet | The number of pits | Average diameter | Electrolysis |
| --- | --- | --- | --- |
| (A) | about 5,600 | 0.08 μm | 1.7% hydrochloric acid 40° C. |
| (B) | about 2,700 | 0.13 μm | 1.7% hydrochloric acid 30° C. |
| (C) | about 1,300 | 0.18 μm | 1.7% hydrochloric acid 20° C. |
| (D) | about 1,000 | 0.25 μm | 1.7% hydrochloric acid + 1% acetic acid 20° C. |
| (E) | about 700 | 0.27 μm | 1.7% hydrochloric acid + 0.4% aluminum ion 20° C. |

TABLE 1-continued

| Aluminum sheet | The number of pits | Average diameter | Electrolysis |
|---|---|---|---|
| (F) | about 300 | 0.29 μm | 1.7% hydrochloric acid + 1.0% aluminum ion 20° C. |

In Table 1, the number of pits is the number of pits having a diameter of 0.03–0.30 μm present on plateaus having an average diameter of about 5 μm per 100 μm$^2$ and the average diameter of the pits is an average value of the diameters of these pits. The center line average roughness (Ra) of these aluminum sheets was 0.5–0.6 μm.

On the surface of the aluminum supports (A)–(E) was coated a physical development nuclei solution prepared by adding a gelatin solution to a silver sol prepared by Carey Lea method so that the weight ratio of silver and gelatin was 2. The coat was dried and then, a silver chloroiodide emulsion (99.4/0.06 mol %) layer was coated thereon and dried to make a photosensitive lithographic printing plate materials.

The resulting lithographic printing plate material was exposed imagewise and then, developed with the diffusion transfer developer described in Example 1 of U.S. Pat. No. 5,273,858, and immediately thereafter the gelatin layer was washed off with running water. Before the surface of the plate dried, a surface protecting liquid was applied to the surface by an absorbent cotton and dried. The thus obtained lithographic printing plate was mounted on a printing machine, A. B. Dick 350CD (manufactured by A. B. Dick Co., Ltd.) and ink receptivity and printing endurance of the printing plate were evaluated.

The ink receptivity was evaluated in the following manner. Simultaneously with contacting the surface of the printing plate with an inking roller, feeding of papers was started and the ink receptivity was evaluated in terms of the number of papers fed before print of good image density began to be obtained. The printing endurance was evaluated in terms of the number of the prints obtained before the printing had become impossible owing to insufficient ink receptivity or occurrence of disappearance of line images. The results are shown in Table 2.

TABLE 2

| Printing plate | Aluminum sheet | Ink receptivity | Printing endurance | |
|---|---|---|---|---|
| 1 | A | 15 | More than 100,000 | The present invention |
| 2 | B | 15 | More than 100,000 | The present invention |
| 3 | C | 15 | More than 100,000 | The present invention |
| 4 | D | 20 | 40,000 | Comparative |
| 5 | E | 20 | 30,000 | Comparative |

EXAMPLE 2

On the aluminum supports (A)–(E) shown in Table 1 was coated a physical development nuclei solution comprising a silver sol prepared by Carey Lea method.

A silver chlorobromide emulsion having the average grain size as shown in Table 3 was prepared by simultaneously adding a mixed aqueous solution of sodium chloride and potassium bromide (potassium bromide 29.5 mol %) and an aqueous silver nitrate solution to an aqueous solution of inert gelatin kept at 60° C. with vigorously stirring. To the resulting emulsion was added potassium iodide in an amount corresponding to 0.5 mol %/1 mol Ag to effect surface replacement. An emulsion layer containing these silver halide emulsion grains was coated on the above-mentioned aluminum support and dried to obtain a photosensitive lithographic printing plate material. The silver halide emulsion coated was a silver chloroiodobromide emulsion comprising 70 mol % of silver chloride, 29.5% of silver bromide and 0.5 mol % of silver iodide, 90% by weight or more of total grains having a size within ±30% of the average size (hereinafter referred to as "monodispersion").

Separately, the above silver halide emulsion having an average grain size of 0.30 μm with less than 90% by weight of total grains having a size within ±30% of the average size was prepared by single jet process (hereinafter referred to as "non-monodispersion) and coated in the same manner as above.

The resulting lithographic printing plate material was exposed imagewise and then, developed with the diffusion transfer developer described in Example 1 of U.S. Pat. No. 5,273,858 to which 40 ml/l of N-methylethanolamine was added, and immediately thereafter the gelatin layer was washed off with running water. Before the surface of the plate dried, a surface protecting liquid was applied to the surface by an absorbent cotton and dried. The thus obtained lithographic printing plate was mounted on a printing machine, Heidelberg TOK (offset printing machine manufactured by Heidelberg Co.) and image quality, ink receptivity and printing endurance of the printing plate were evaluated.

As for the image quality, the printing plate material was exposed through a contact original and developed, and when negative ruled lines and positive ruled lines of 10 μm could be simultaneously reproduced on the printing plate material, the image quality of this printing plate is graded to be "good", when negative ruled lines and positive ruled lines of 15 μm could be simultaneously reproduced on the printing plate, the image quality of this printing plate is graded to be "fair", and when only negative ruled lines and positive ruled lines of 20 μm could be simultaneously reproduced on the printing plate, the image quality of this printing plate is graded to be "poor". The printing endurance was evaluated in terms of the number of prints obtained before the printing had become impossible owing to the occurrence of insufficient ink reception on the image portion or the occurrence of partial disappearance of the lines under a plate-blanket nip width of 5 mm. The results are shown in Table 3.

TABLE 3

| Printing plate | Aluminum sheet | Average grain size (μm) | Monodispersion or non-monodispersion | Average diameter of pits (μm) | Image quality | Printing endurance |
|---|---|---|---|---|---|---|
| 6 | A | 0.28 | Monodispersion | 0.08 | good | 50,000 |

TABLE 3-continued

| Printing plate | Aluminum sheet | Average grain size (μm) | Monodispersion or non-monodispersion | Average diameter of pits (μm) | Image quality | Printing endurance |
| --- | --- | --- | --- | --- | --- | --- |
| 7 | A | 0.72 | Monodispersion | 0.08 | poor | 10,000 |
| 8 | B | 0.15 | Monodispersion | 0.13 | fair | 20,000 |
| 9 | B | 0.28 | Monodispersion | 0.13 | good | 50,000 |
| 10 | B | 0.50 | Monodispersion | 0.13 | good | 50,000 |
| 11 | B | 0.72 | Monodispersion | 0.13 | poor | 10,000 |
| 12 | B | 0.30 | Non-monodispersion | 0.13 | fair | 20,000 |
| 13 | C | 0.28 | Monodispersion | 0.18 | good | 50,000 |
| 14 | C | 0.72 | Monodispersion | 0.18 | poor | 10,000 |
| 15 | D | 0.28 | Monodispersion | 0.25 | poor | 2,000 |
| 16 | E | 0.28 | Monodispersion | 0.27 | poor | 1,000 |

EXAMPLE 3

On the aluminum support (A) shown in Table 1 was coated a physical development nuclei solution comprising a silver sol prepared by Carey Lea method and dried. Thereafter, in the same manner as in Example 2, thereon was coated a silver chloroiodide (99.6/0.04 mol %) emulsion layer having the halogen composition as shown in Table 4 and containing silver halide grains having average grain size of about 0.3 μm with 90% by weight or more of total grains having a size within ±30% of the average size and the coat was dried to make a photosensitive lithographic printing plate material.

The resulting lithographic printing plate material was exposed imagewise and then, developed with the diffusion transfer developer described in Example 1 of U.S. Pat. No. 5,273,858, and immediately thereafter the gelatin layer was washed off with running water. Before the surface of the plate dried, a surface protecting liquid was applied to the surface by an absorbent cotton and dried. Image quality and printing endurance of the thus obtained lithographic printing plate were evaluated in the same manner as in Example 2 except that the plate-blanket nip width was set at 6 mm to conduct severe evaluation of the printing endurance. The results are shown in Table 4.

TABLE 4

| Printing plate | Aluminum sheet | Content of silver-chloride | Average diameter of pits (μm) | Image quality | Printing endurance |
| --- | --- | --- | --- | --- | --- |
| 17 | A | 99.7% | 0.08 | good | More than 100,000 |
| 18 | A | 93.7% | 0.08 | good | More than 100,000 |
| 19 | A | 87.7% | 0.08 | fair-good | 50,000 |
| 20 | A | 77.7% | 0.08 | fair | 20,000 |

It can be seen from the results of Table 4 that printing plates 17, 18 and 19 made using the emulsion containing at least 85% of silver chloride were superior in both the image quality and printing endurance.

EXAMPLE 4

On the aluminum supports (A), (B), (C) and (F) of Table 1 was coated a physical development nuclei solution prepared by adding a gelatin solution to a silver sol prepared by Carey Lea method so that the weight ratio of silver and gelatin was 1:1. After drying, thereon was coated a silver chloroiodide (99.6/0.04 mol %) emulsion layer and dried to make a photosensitive lithographic printing plate material. The silver halide emulsion contained $3 \times 10^{-6}$ mol of potassium hexachloroiridate (IV) per 1 mol of silver halide which was added at the time of physical ripening and average grain size of the emulsion was 0.45 micron. The chemical sensitization was carried out with $3 \times 10^{-5}$ mol of sodium thiosulfate and $4 \times 10^{-5}$ mol of $HAuCl_4$ per 1 mol of silver halide and the exemplified dye (2) described in U.S. Pat. No. 4,621,041 was added in an amount of $3 \times 10^{-4}$ mol per 1 mol of silver halide as a sensitizing dye.

The thus obtained lithographic printing plate material was subjected to scanning exposure with helium-neon laser beam and thereafter, in the same manner as in Example 1, was treated and evaluated on the ink receptivity and printing endurance. The results are shown in Table 5. All of the lithographic printing plates were superior in image quality.

TABLE 5

| Printing plate | Aluminum sheet | Ink receptivity | Printing endurance |
| --- | --- | --- | --- |
| 21 | A | 15 | More than 100,000 |
| 22 | B | 15 | More than 100,000 |
| 23 | C | 15 | More than 100,000 |
| 24 | F | 25 | 30,000 |

EXAMPLE 5

On the aluminum supports (A), (B), (C) and (F) of Table 1 was coated a physical development nuclei solution prepared by adding a gelatin solution to a sol of reduced palladium nuclei. Furthermore, after drying, thereon were coated a silver chloroiodide (99.6/0.04 mol %) emulsion layer containing no 1-phenyl-5-mercaptotetrazole (PMT) or a silver halide emulsion layer containing 1-phenyl-5-mercaptotetrazole (PMT) in an amount of $5 \times 10^{-4}$ mol per 1 mol of silver halide and dried to make eight lithographic printing plate materials.

The lithographic printing plate materials were exposed imagewise through a contact screen of 175 lines/inch and thereafter, in the same manner as in Example 1, were treated and evaluated on the printing endurance. The printing endurance was evaluated in terms of the number of prints obtained before printing had become impossible owing to occurrence of disappearance of minute dot image part and graded by the following criteria. The results are shown in Table 6. On the printing plate made using the emulsion containing PMT, the minute dots were satisfactorily formed.

Evaluation of printing endurance:
3: 100,000–20,000 or more prints
2: 50,000–100,000 prints
1: Less than 50,000 prints Degree of corrosion of aluminum was evaluated by the following criteria and the results are shown in Table 6.
3: No corrosion occurred.
2: Some corrosion occurred.
1: Considerable corrosion occurred.

TABLE 6

| Printing plate | Aluminum sheet | PMT | Printing endurance | Corrosion of aluminum |
|---|---|---|---|---|
| 25 | A | No | 2 | 2 |
| 26 | A | Present | 3 | 3 |
| 27 | B | No | 2 | 2 |
| 28 | B | Present | 3 | 3 |
| 29 | C | No | 2 | 2 |
| 30 | C | Present | 3 | 3 |
| 31 | F | No | 1 | 2 |
| 32 | F | Present | 1 | 3 |

EXAMPLE 6

Example 5 was repeated except that 2-mercaptobenzimidazole, 2-mercaptobenzothiazole, 3-ethylbenzothiazoline-2-thion, 2-mercaptobenzoxazole, 2-mercapto-1,3,4-oxadiazole, 3-mercapto-4-phenylacetamido-5-methyl-1,2,4-triazole, or 3-mercapto-4-acetamido-5-heptyl-1,2,4-triazole was used in place of PMT used in the silver halide emulsion. The results were similar to those of Example 5.

EXAMPLE 7

Aluminum sheets of 0.30 mm thick having the surface configuration and the amount of the anodized film as shown in Table 7 were produced by elctrolytic graining treatment under various conditions and by anodization.

TABLE 7

| Aluminum sheet | The number of pits | Average diameter | Amount of anodized film (x) | Electrolysis |
|---|---|---|---|---|
| (O) | about 5,600 | 0.08 μm | 1.8 g/m² | 1.7% hydrochlorid acid 40° C. |
| (P) | about 5,600 | 0.08 μm | 2.5 g/m² | 1.7% hydrochloric acid 40° C. |
| (Q) | about 5,600 | 0.08 μm | 3.5 g/m² | 1.7% hydrochloric acid 40° C. |
| (R) | about 2,700 | 0.13 μm | 1.7 g/m² | 1.7% hydrochloric acid 30° C. |
| (S) | about 2,700 | 0.13 μm | 2.4 g/m² | 1.7% hydrochloric acid 30° C. |
| (T) | about 2,700 | 0.13 μm | 3.6 g/m² | 1.7% hydrochloric acid 30° C. |
| (U) | about 1,300 | 0.18 μm | 1.6 g/m² | 1.7% hydrochloric acid 20° C. |
| (V) | about 1,300 | 0.18 μm | 2.5 g/m² | 1.7% hydrochloric acid 20° C. |
| (W) | about 1,300 | 0.18 μm | 3.6 g/m² | 1.7% hydrochloric acid 20° C. |

In Table 7, the number of pits is the number of pits having a diameter of 0.03–0.30 μm present on plateaus having an average diameter of about 5 μm per 100 μm² and the average diameter of the pits is an average value of the diameters of these pits. The center line average roughness (Ra) of these aluminum sheets was 0.5–0.6 μm. Amount (X) of the anodized aluminum film is the weight of the film per 1 m² measured by the chemical stripping method described in JIS H8680.

On these aluminum supports was coated a silver sol prepared by Carey Lea method as a physical development nuclei solution. After drying, thereon was coated a silver chloroiodide (99.6/0.04 mol %) emulsion layer and dried to make a photosensitive lithographic printing plate material. Binder content in the silver halide emulsion layer was changed from 0.7 to 2.0 g/m².

The thus obtained lithographic printing plate material was exposed imagewise and then treated and evaluated on ink receptivity and printing endurance in the same manner as in Example 1. The results are shown in Table 8. In Table 8, Y shows a coating amount of the hydrophilic binder per 1 m² and X/Y is the ratio of the coating amount (X) of anodized aluminum to Y.

TABLE 8

| Printing plate | Aluminum sheet | X | Y | X/Y | Ink receptivity | Printing endurance |
|---|---|---|---|---|---|---|
| 33 | (O) | 1.8 | 0.8 | 2.25 | 15 | More than 100,000 |
| 34 | (P) | 2.5 | 0.8 | 3.13 | 15 | More than 100,000 |
| 35 | (Q) | 3.5 | 0.8 | 4.38 | 15 | More than 100,000 |
| 36 | (R) | 1.7 | 0.7 | 2.43 | 15 | More than 100,000 |
| 37 | (S) | 2.4 | 1.0 | 2.40 | 15 | More than 100,000 |
| 38 | (T) | 3.6 | 1.0 | 3.60 | 15 | More than 100,000 |
| 39 | (U) | 1.6 | 0.7 | 2.29 | 15 | More than 100,000 |
| 40 | (V) | 2.5 | 1.0 | 2.50 | 15 | More than 100,000 |
| 41 | (W) | 3.5 | 1.2 | 2.92 | 15 | More than 100,000 |
| 42 | (O) | 1.8 | 1.4 | 1.29 | 15 | 60,000 |
| 43 | (R) | 1.7 | 1.0 | 1.70 | 15 | 70,000 |
| 44 | (S) | 2.4 | 1.3 | 1.85 | 15 | 70,000 |
| 45 | (T) | 3.6 | 2.0 | 1.80 | 20 | 60,000 |
| 46 | (U) | 1.6 | 1.0 | 1.60 | 15 | 70,000 |
| 47 | (V) | 2.5 | 1.5 | 1.67 | 20 | 60,000 |

EXAMPLE 8

On the aluminum supports (A), (D) and (E) of Table 1 were coated three physical development nuclei solutions (a), (b) and (c) prepared by adding a gelatin solution to a hydrosol of reduced silver so that the weight ratio of silver and gelatin was 1:0 (a), 1:0.1 (b) and 1:1 (c), respectively. After drying, a silver chloroiodide (99.6%/0.04 mol %) emulsion layer was coated thereon to make photosensitive lithographic printing plate materials.

The thus obtained lithographic printing plate materials were exposed imagewise and then treated and evaluated on ink receptivity and printing endurance in the same manner as in Example 1. The results are shown in Table 9.

The results of evaluation of printing endurance are graded by the following criteria:
1: Less than 10,000 prints.
2: More than 30,000 prints.
3: More than 50,000 prints.
4: More than 100,000 prints.
5: More than 200,000 prints.

TABLE 9

| Printing plate | Aluminum sheet | Nuclei | Ink receptivity | Printing endurance |
|---|---|---|---|---|
| 48 | A | a | 5 | 5 |
| 49 | A | b | 5 | 5 |
| 50 | A | c | 15 | 4 |
| 51 | D | a | 15 | 3 |
| 52 | D | b | 15 | 3 |
| 53 | D | c | 20 | 2 |
| 54 | E | a | 15 | 3 |
| 55 | E | b | 15 | 3 |
| 56 | E | c | 20 | 2 |

EXAMPLE 9

On the aluminum supports (A)–(E) of Table 1 was coated a physical development nuclei solution comprising a silver sol prepared by Carey Lea method.

An aqueous solution of inert gelatin was kept at 60° C. and to the solution under vigorously stirring were added simultaneously an aqueous silver nitrate solution and an aqueous sodium chloride solution at a rate of 4 ml/min to prepare a silver chloride emulsion. The emulsion grains had an average grain size of 0.3 μ and had a crystal habit of cube with 90% by weight or more of the total grains having a size within ±30% of the average size. The thus obtained emulsion was subjected to precipitation and washing with water by conventional methods and then redissolved, followed by adding a gelatin solution so that the weight ratio of gelatin and silver was 1:1.

Then, an aqueous potassium iodide solution in an amount of 0.01 mol/mol Ag was added and pH was adjusted to 6.5 and EAg was adjusted to 230 mV. Then, thiourea dioxide and potassium chloroaurate were added, followed by ripening at 60° C. for 90 minutes to fog the emulsion. Thereafter, 300 mg/mol Ag of a dye having the following structural formula and 200 mg/mol Ag of pinakryptol yellow were added and a surface active agent was further added and pH was adjusted to 6.5 to prepare a direct positive silver halide emulsion. The resulting silver halide emulsion was coated on the above aluminum support which had been coated with the physical development nuclei solution.

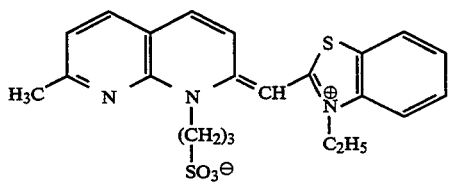

The thus obtained lithographic printing plate material was subjected to image outputting using an argon laser output device of external drum and developed with the diffusion transfer developer described in Example 1 of Japanese Patent Kokai No. 4-282295 to which 10 ml/l of N-methylethanolamine was added. Immediately thereafter, the gelatin layer was washed off with running water. Before the surface of the printing plate dried, the surface protecting solution was applied to the surface with adsorbent wadding and dried.

The resulting lithographic printing plates were evaluated on image quality and printing endurance in the same manner as in Example 2. The results are shown in Table 10.

TABLE 10

| Printing plate | Aluminum sheet | The number of pits | Average diameter | Image quality | Printing endurance |
|---|---|---|---|---|---|
| 57 | A | about 5,600 | 0.08 μm | good | 50,000 |
| 58 | B | about 2,700 | 0.13 μm | good | 50,000 |
| 59 | C | about 1,300 | 0.18 μm | good | 50,000 |
| 60 | D | about 1,000 | 0.25 μm | poor | 5,000 |
| 61 | E | about 700 | 0.27 μm | poor | 3,000 |

As is clear from the results of Table 10, the lithographic printing plates 57, 58 and 59 of the present invention in which an aluminum sheet having 500 or more pits of 0.03–0.30 μm in diameter and of 0.05–0.20 μm in average diameter per 100 μm² was used were superior in image quality and printing endurance. On the other hand, the comparative lithographic printing plates 60 and 61 in which an aluminum sheet having pits of more than 0.20 μm was used were inferior in the image quality and printing endurance.

EXAMPLE 10

On the aluminum support (A) of Table 1 was coated a physical development nuclei solution comprising a silver sol prepared by Carey Lea method. Then, a direct positive silver halide emulsion prepared in the same manner as in Example 9 was coated on the above aluminum support which had been coated with the physical development nuclei solution.

The thus obtained lithographic printing plate material was subjected to image outputting using an argon laser output device of external drum. After subjected to the outputting, the material was developed at 20° C. for 10 seconds with a developer having the following composition to which 20 g of a polyalkylene oxide shown in Table 11 was added. Immediately thereafter, the surface was washed with running water for 30 seconds to wash off the gelatin layer.

| Formulation of developer: | |
|---|---|
| Hydroquinone | 20 g |
| Phenidone | 2 g |
| Sodium sulfite | 80 g |
| EDTA | 4 g |
| Sodium hydroxide | 22 g |
| N-methylethanolamine | 10 g |
| Water to make up 1000 cc in total. | |

The thus obtained lithographic printing plates were evaluated on image quality and printing endurance in the same manner as in Example 2. The results are shown in Table 11.

TABLE 11

| | Kind of polyalkylene oxide and average molecular weight thereof | | Printing endurance | Image quality |
|---|---|---|---|---|
| Developer 1 | No | | 50,000 | fair |
| Developer 2 | PEO | 100 | 70,000 | good |
| Developer 3 | PEO | 200 | More than 100,000 | good |
| Developer 4 | PEO | 300 | More than 100,000 | good |
| Developer 5 | PEO | 400 | More than 100,000 | good |

TABLE 11-continued

| | Kind of polyalkylene oxide and average molecular weight thereof | | Printing endurance | Image quality |
|---|---|---|---|---|
| Developer 6 | PEO | 600 | 80,000 | fair |
| Developer 7 | PPO | 200 | 90,000 | good |
| Developer 8 | PPO | 400 | More than 100,000 | good |
| Developer 9 | PBuO | 300 | More than 100,000 | good |

PEO: Polyethylene oxide
PPO: Polypropylene oxide
PBuO: Polybutylene oxide

What is claimed is:

1. A lithographic printing plate material which comprises a grained and anodized aluminum support and a silver halide emulsion layer between which physical development nuclei are provided wherein said aluminum support have 500 or more pits having a diameter of 0.03–0.30 μm and an average diameter of 0.05–0.20 μm per 100 μm².

2. A lithographic printing plate material according to claim 1 wherein depth of the pits is ⅓ or more of the diameter.

3. A lithographic printing plate material according to claim 1 wherein average grain size of the silver halide emulsion is 0.2–0.6 μm and 90% by weight or more of total grains have a size within ±30% of the average grain size.

4. A lithographic printing plate material according to claim 3 wherein the silver halide emulsion comprises 85 mol % or more of silver chloride.

5. A lithographic printing plate material according to claim 1 wherein the silver halide emulsion contains a water-soluble gold compound and a water-soluble iridium compound which is added at the time of emulsification or physical ripening.

6. A lithographic printing plate material according to claim 1 wherein the layers constituting the material contain a compound having a mercapto group or a thione group.

7. A lithographic printing plate material according to claim 1 wherein weight ratio of the amount of anodized film of the aluminum sheet to the total amount of hydrophilic binder on the lithographic printing plate material is 2 or more.

8. A lithographic printing plate material according to claim 1 wherein the physical development nuclei substantially contact with the anodized layer.

9. A lithographic printing plate material according to claim 1 wherein the silver halide emulsion is a previously fogged direct positive silver halide emulsion.

* * * * *